United States Patent
Herzka et al.

(10) Patent No.: US 8,076,934 B2
(45) Date of Patent: Dec. 13, 2011

(54) BLACK-BLOOD STEADY-STATE FREE PRECESSION MAGNETIC RESONANCE IMAGING

(75) Inventors: Daniel A. Herzka, Rockville, MD (US); John A. Derbyshire, Silver Spring, MD (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 265 days.

(21) Appl. No.: 12/297,469

(22) PCT Filed: Apr. 3, 2007

(86) PCT No.: PCT/US2007/065839
§ 371 (c)(1),
(2), (4) Date: Jun. 4, 2009

(87) PCT Pub. No.: WO2007/124244
PCT Pub. Date: Nov. 1, 2007

(65) Prior Publication Data
US 2009/0315559 A1      Dec. 24, 2009

Related U.S. Application Data

(60) Provisional application No. 60/745,197, filed on Apr. 20, 2006.

(51) Int. Cl.
*G01V 3/00* (2006.01)
(52) U.S. Cl. .................................. 324/306; 324/309
(58) Field of Classification Search .................. 324/306, 324/309; 600/419
See application file for complete search history.

(56) References Cited

U.S. PATENT DOCUMENTS

| | | | |
|---|---|---|---|
| 6,885,193 B2 | 4/2005 | Foxall | |
| 7,369,887 B2 * | 5/2008 | Fayad et al. | 600/413 |
| 7,560,925 B1 * | 7/2009 | Nishimura et al. | 324/309 |
| 2003/0062893 A1 | 4/2003 | Overall | |
| 2005/0007112 A1 | 1/2005 | Deimling | |
| 2005/0010104 A1 | 1/2005 | Fayad et al. | |

OTHER PUBLICATIONS

Lin, H-Y., et al.; Flow Suppression Effect in Dual Steady States Acquisition; 2005; Proc. Intl. Soc. Mag. Reson. Med.; 13:1762.
Lin, H-Y., et al.; Rapid Dark Blood Imaging with High SNR from Random Velocity-Encoding Variation Method in Radial SSFP Acquisition; Proc. Intl. Soc. Mag. Reson. Med.; 11:451.
Lin, H-Y., et al.; Blood Attenuation with SSFP-Compatible Saturation (BASS); 2006; Journal of Magnetic Resonance Imaging; 24:701-707.

* cited by examiner

*Primary Examiner* — Louis Arana

(57) ABSTRACT

In an imaging method, periodic maintenance radio frequency pulses ($\alpha$, $-\alpha$) are applied to maintain a steady state magnetic resonance excitation in an imaging region. Readout (66) of imaging data from the imaging region is performed during selected intervals between maintenance radio frequency pulses. A spatially selective blood signal suppression sequence (62, 62') is performed during selected other intervals between maintenance radio frequency pulses. The blood signal suppression sequence suppresses a blood signal in a suppression region different from the imaging region. The blood signal suppression sequence has substantially no zero the moment applied magnetic field gradient.

23 Claims, 5 Drawing Sheets

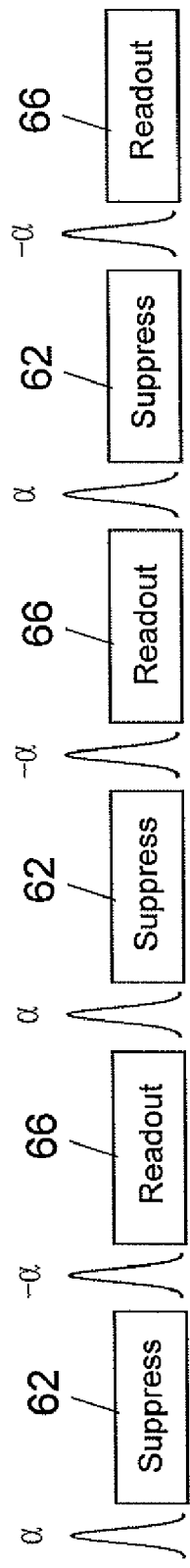
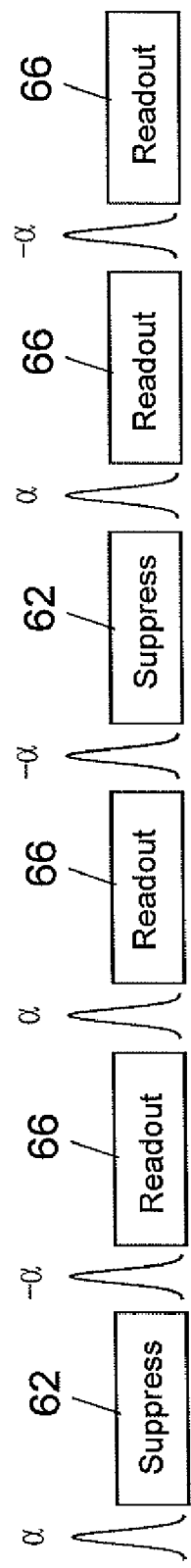
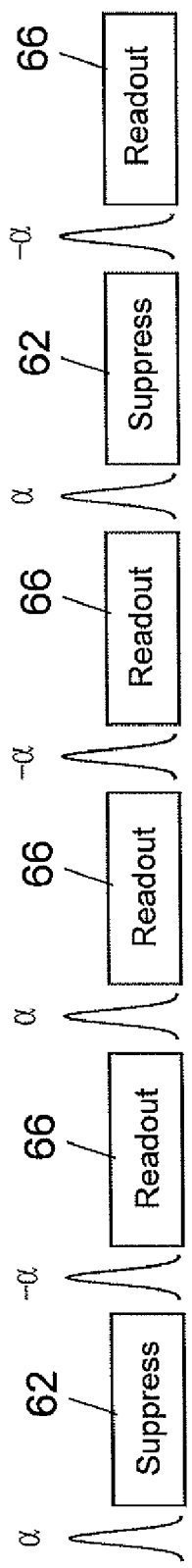

BLACK-BLOOD STEADY-STATE FREE PRECESSION MAGNETIC RESONANCE IMAGING

CROSS REFERENCE TO RELATED APPLICATIONS

This application claims the benefit of U.S. provisional application Ser. No. 60/745,197 filed Apr. 20, 2006, which is incorporated herein by reference.

The following relates to labeling moving tissue in magnetic resonance imaging and to steady state magnetic resonance imaging. It is described with particular reference to black blood magnetic resonance imaging using the balanced Steady State Free Precession (SSFP) data acquisition technique. However, it finds application more generally in black blood steady state imaging techniques, such as Fast Imaging Employing Steady State Acquisition (FIESTA), Fast Imaging with Steady Precession (TrueFISP), Balanced Fast Field Echo (BFFE), or so forth, and still more generally in magnetic resonance angiography using steady state imaging.

Balanced SSFP, FIESTA, TrueFISP, BFFE, and other steady-state magnetic resonance imaging techniques have gained popularity as providing relatively high signal-to-noise ratio coupled with relatively fast acquisition times. In these steady-state coherent sequences, the magnetization excited in one repetition time (TR) survives into the next TR period, and is reinforced by periodically applied maintenance radio frequency pulses, such as one maintenance pulse per TR period, to maintain a steady state magnetic resonance excitation in an imaging region. This maintenance of the magnetization across TR periods facilitates the use of high excitation flip angles, which increases the magnitude of the transverse component of the magnetization and therefore increases the signal detected from stationary spins.

The use of high flip angles also leads to high signal intensities from freshly inflowing, moving spins relative to static in-slice spins that have previously experienced the imaging process. For example, blood entering an imaging slice carries magnetization in thermal equilibrium and when such magnetization is excited by a high flip angle, it produces very high signal intensities. Such a strong signal can be advantageous when interested in studying the volumes occupied by blood, as is the case of functional cardiac imaging which interrogates the ventricles. However, it has been very difficult to generate so-called "black blood" images in which the blood signal is suppressed relative to the signal from stationary tissue. Black blood imaging is useful because it can accurately represent the internal vascular lumen so as to detect stenoses, partial plaque buildup blockages, aneurysms, and other vascular problems.

In some black blood imaging approaches, a magnetic contrast agent is administered to the patient, and enters the blood stream. The magnetic contrast agent is selected to suppress the blood signal. However, use of a magnetic contrast agent is interventional, and there is preference for techniques that do not involve administering a magnetic contrast agent to the patient.

Non-interventional black blood techniques typically employ inversion pulses, saturation pulses, $T_2$-prep pulses, or other magnetic resonance sequences that actively manipulate magnetic resonances to suppress the blood signal. These techniques are generally difficult to apply in conjunction with steady state imaging techniques, because the steady state maintenance is interrupted during the blood signal suppression sequence. The active manipulation of magnetic resonances to achieve a black blood condition typically has the deleterious secondary effect of substantially interfering with maintenance of the steady state magnetic resonance excitation in the imaging region.

Deimling, U.S. Published Application No. 2005/0007112 A1, discloses a technique for combining steady state imaging with an active magnetic resonance sequence for black blood suppression. In the technique of Deimling, a sequence of slice-selective periodic maintenance radio frequency pulses of the form $+\alpha, -\alpha, +\alpha, -\alpha, \ldots$ (where $\alpha$ denotes the flip- or tip-angle of the pulse) is modified in that the $-\alpha$ pulses are replaced by spatially non-selective radio frequency pulses $-\alpha$. The tissue inside of the imaging region sees the steady-state maintenance sequence $+\alpha, -\alpha, +\alpha, -\alpha, \ldots$, whereas tissue outside of the imaging region sees the sequence $-\alpha, -\alpha, -\alpha, -\alpha, \ldots$ which suppresses signal from tissue outside the imaging region, including blood signal.

However, the approach of Deimling has certain disadvantages. The spatially non-selective radio frequency pulses $-\alpha$ nominally have flip angle $-\alpha$. However, in reality, for the $+\alpha$ pulses, the flip-angle can be expected to vary spatially over the excited volume. This can lead to steady state instability and degraded image quality. Moreover, the spins excited in the extended volume by the spatially non-selective pulses $-\alpha$ may persist and project artifacts into the images. Off-resonance spins such as fat in the outer volume may not be effectively suppressed by this technique, again leading to projection of artifacts into the images. Yet another disadvantage of the Deimling technique is that it does not provide directional blood signal suppression. Thus it cannot, for example, selectively suppress arterial blood flow into the imaging region without concomitant suppression of venous blood flow into the imaging region, or vice versa.

The present application provides a new and improved methods and apparatuses which overcome the above-referenced problems and others.

In accordance with one aspect, an imaging method is disclosed. Periodic maintenance radio frequency pulses are applied to maintain a steady state magnetic resonance excitation in an imaging region. Readout of imaging data from the imaging region is performed during selected intervals between maintenance radio frequency pulses. A spatially selective blood signal suppression sequence is performed during selected other intervals between maintenance radio frequency pulses. The blood signal suppression sequence suppresses a blood signal in a suppression region different from the imaging region. The blood signal suppression sequence has substantially no zeroeth moment applied magnetic field gradient.

In accordance with another aspect, an apparatus is disclosed for performing the imaging method set forth in the preceding paragraph.

In accordance with another aspect, a magnetic resonance imaging system is disclosed. A main magnet generates a static magnetic field at least in an imaging region. A gradient generating system superimposes selected magnetic field gradients on the static magnetic field at least in the imaging region. A radio frequency system includes at least one radio frequency coil arranged to transmit radio frequency pulses into the imaging region and to receive magnetic resonance signals from the imaging region. A reconstruction processor reconstructs the received magnetic resonance signals to form a reconstructed image. A sequence controller controls the gradient generating system and the magnetic resonance excitation system according to the imaging method of the first paragraph of this Summary.

In accordance with another aspect, an imaging system is disclosed. Means is provided for applying periodic maintenance radio frequency pulses to maintain a steady state magnetic resonance excitation in an imaging region. Means is provided for performing readout of imaging data from the imaging region during selected intervals between maintenance radio frequency pulses. Means is provided for performing a spatially selective blood signal suppression sequence during selected other intervals between maintenance radio frequency pulses, the blood signal suppression sequence suppressing a blood signal in a suppression region different from the imaging region, the blood signal suppression sequence having substantially no zeroeth moment applied magnetic field gradient.

In accordance with another aspect, an imaging method is disclosed. A steady state magnetic resonance imaging sequence configured to image an imaging region is performed. During the performing, selected readout portions of the steady state magnetic resonance imaging sequence are replaced with a spatially selective moving tissue alteration sequence configured to alter a signal of the moving tissue in an alteration region from which the moving tissue moves into the imaging region. The moving tissue alteration sequence has substantially no zeroeth moment applied magnetic field gradient.

In accordance with another aspect, an apparatus is disclosed for performing the imaging method set forth in the preceding paragraph.

One advantage resides in labeling blood or other moving tissue in steady state imaging with reduced image artifacts and improved image quality.

Another advantage resides in compatibility with various steady state imaging techniques, and compatibility with various magnetic resonance sequences that actively manipulate magnetic resonances to suppress the blood signal.

Another advantage resides in providing a black blood steady state imaging technique in which the amount of blood signal suppression can be tuned to account for blood flow rate and other factors.

Another advantage resides in the ability to selectively suppress the signal from venous blood flowing into the imaging region without suppressing the signal from arterial blood flowing into the imaging region, or vice versa. This enables the disclosed techniques to generate venograms, arteriograms, or both.

Still further advantages of the present invention will be appreciated to those of ordinary skill in the art upon reading and understand the following detailed description.

The invention may take form in various components and arrangements of components, and in various steps and arrangements of steps. The drawings are only for purposes of illustrating the preferred embodiments and are not to be construed as limiting the invention.

FIG. 1 diagrammatically shows a magnetic resonance imaging system configured to perform black blood steady state magnetic resonance imaging.

FIG. 2 diagrammatically shows an approach for integrating a blood signal suppression sequence with a steady state imaging sequence, in which a ratio of blood signal suppression sequences to readout sequences is 1:1.

FIG. 3 diagrammatically shows an approach for integrating a blood signal suppression sequence with a steady state imaging sequence, in which a ratio of blood signal suppression sequences to readout sequences is 1:2.

FIG. 4 diagrammatically shows an approach for integrating a blood signal suppression sequence with a steady state imaging sequence, in which a ratio of blood signal suppression sequences to readout sequences is 1:3.

Figure 1:
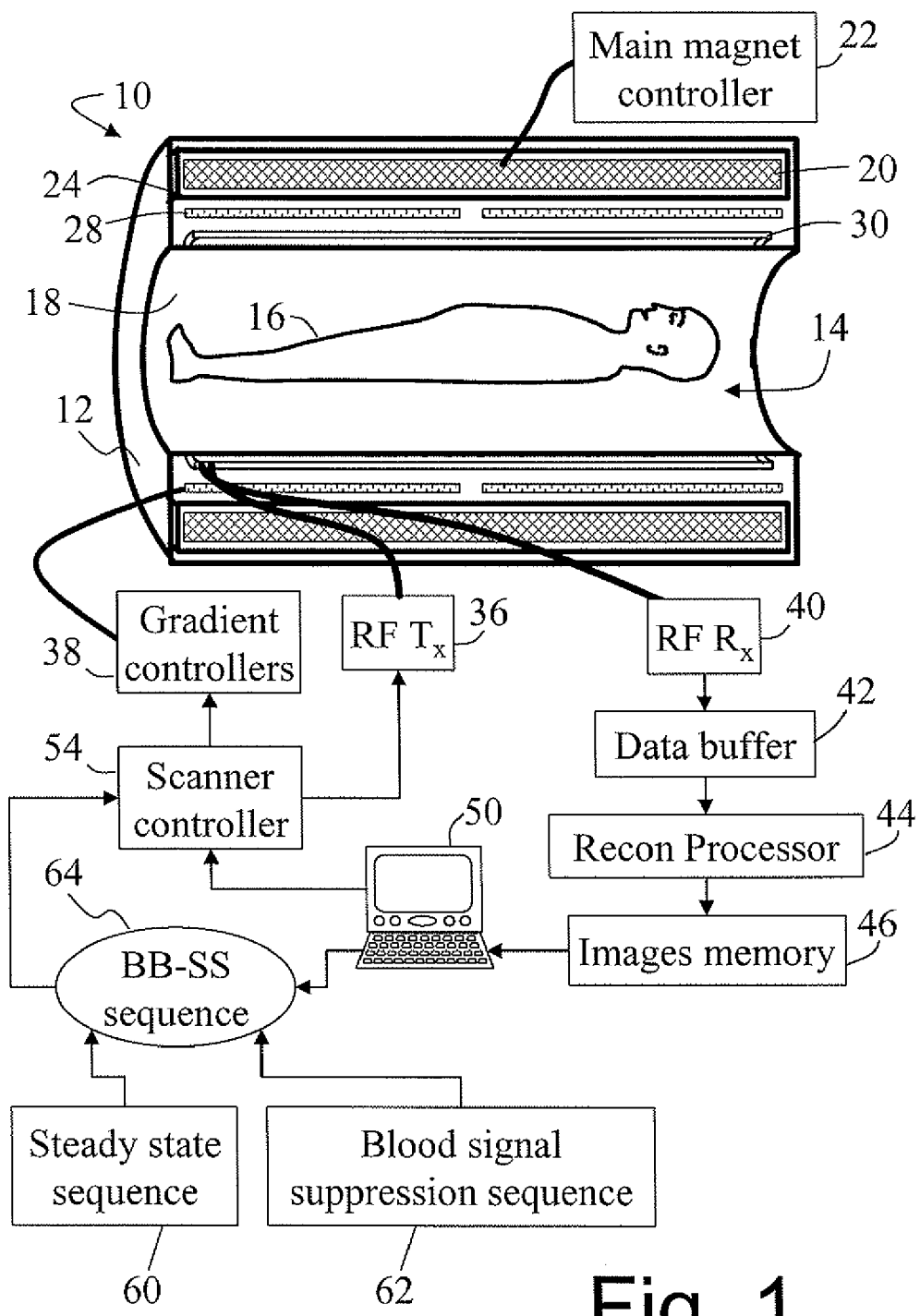

With reference to FIG. 1, a magnetic resonance scanner 10 includes a scanner housing 12 including a bore 14 or other receiving region for receiving a patient or other subject 16. A main magnet 20 disposed in the scanner housing 12 is controlled by a main magnet controller 22 to generate a main $B_0$ magnetic field at least in a region of interest of the bore 14. Typically, the main magnet 20 is a persistent superconducting magnet surrounded by cryoshrouding 24, although a resistive, permanent, or other type of main magnet can be used.

Magnetic field gradient coils 28 are arranged in or on the housing 12 to superimpose selected magnetic field gradients on the main magnetic field at least in a region of interest. Typically, the magnetic field gradient coils include coils for producing three orthogonal magnetic field gradients, such as an x gradient, y gradient, and z gradient. A whole body radio frequency coil 30 is optionally disposed in housing 12, as shown, or in the bore 14 of the scanner 10, to inject $B_1$ radio frequency excitation pulses and to receive excited magnetic resonance signals. Additionally or alternatively, one or more local coils or coils arrays (not shown) may be used to excite and/or receive magnetic resonance.

During magnetic resonance data acquisition, a radio frequency transmitter 36 is coupled to the whole body radio frequency coil 30 as shown, or to a local coil or coils array, to generate magnetic resonance signals in a region of interest of a subject disposed in the bore 14. A magnetic field gradients controller 38 operates the magnetic field gradient coils 28 to spatially localize, spatially encode, or otherwise manipulate the generated magnetic resonances. During the magnetic resonance readout phase, a radio frequency receiver 40 coupled to the coil 30, as shown, or to a local coil or coils array, receives magnetic resonance signal samples of which are stored in a data buffer 42. The received magnetic resonance samples are processed by a reconstruction processor 44 using a Fourier transform reconstruction algorithm, a back-projection reconstruction algorithm, or another reconstruction algorithm comporting with the spatial encoding of the magnetic resonance signal samples to generate a reconstructed image that is stored in an images memory 46.

A user interface 50 displays the reconstructed image or other processed data representation to a physician, radiologist, or other user. In the example embodiment illustrated in FIG. 1, the user interface 50 also interfaces the user with a scanner controller 54 to control the magnetic resonance scanner 10. In other embodiments, a separate scanner control interface may be provided. For black blood steady state imaging, a steady state imaging sequence 60, such as balanced SSFP, FIESTA, TrueFISP, BFFE, or so forth, is integrated with a blood signal suppression sequence 62 configured to suppress the resonance response from blood so as to produce a black blood steady state sequence 64 to be executed by the scanner controller 54.

It is to be appreciated that various illustrated components can be integrated in various ways. For example, if the user interface 50 is a computer, then the reconstruction processor 44, scanner controller 54, data memories 42, 46, 60, 62 or other components are optionally integrated with the user interface 50 as software components, non-volatile memory units, processors, collectively a computer programmable medium, or so forth.

With reference to FIG. 2, the integration of the steady state imaging sequence 60 and the blood signal suppression sequence 62 is described in overview. The steady state imaging sequence 60 includes a periodic sequence of maintenance radio frequency pulses of the form $+\alpha, -\alpha, +\alpha, -\alpha, \ldots$ (where $\alpha$ denotes the flip-angle of the pulse) that maintain a steady state magnetic resonance excitation in an imaging region. Although not illustrated, it is contemplated to precede initiation of the $+\alpha, -\alpha, +\alpha, -\alpha, \ldots$ maintenance pulses with a "start-up" sequence that more efficiently ramps up the spin system to the desired steady state excitation. Alternatively, by applying the $+\alpha, -\alpha, +\alpha, -\alpha, \ldots$ pulses over a sufficient time interval, the steady state excitation is achieved. During the start-up portion, imaging data is typically not acquired.

Once steady state excitation is reached in a conventional steady state magnetic resonance sequence, a readout sub-sequence 66 for reading imaging data from the imaging region is performed during the intervals between maintenance radio frequency pulses. In the black blood steady state sequence 64, however, every other readout sub-sequence of the steady state imaging sequence 60 is replaced by an instance of the blood signal suppression sequence 62. As will be described below, the blood signal suppression sequence 62 is configured to suppress blood signal in a suppression region different from the imaging region. The blood signal suppression sequence 62 has certain constraints which ensure that it provides sufficient blood signal suppression while additionally not adversely affecting the maintenance of steady state magnetic resonance excitation in an imaging region. These constraints include ensuring that the blood signal suppression sequence 62 has substantially no zeroeth moment applied magnetic field gradient.

With continuing reference to FIG. 2 and with further reference to FIGS. 3 and 4, the replacement of selected readout sub-sequences with the blood signal suppression sequence 62 results in slower overall imaging data acquisition due to the loss of the replaced readout sub-sequences. For the black blood steady state sequence 64 of FIG. 2, the reduction in data acquisition rate compared with the unmodified steady state imaging sequence 60 is 50%, since every other readout sub-sequence is replaced (that is, the ratio of blood signal suppression sequences 62 to readout sequences is 1:1). On the other hand, FIG. 3 shows a different black blood steady state sequence 64' in which only one in every three readout sub-sequences is replaced by the blood signal suppression sequence 62 (that is, the ratio of blood signal suppression sequences 62 to readout sequences is 1:2); accordingly, for the black blood steady state sequence 64' the reduction in data acquisition rate is only 33%. FIG. 4 shows a different black blood steady state sequence 64" in which only one in every four readout sub-sequences is replaced by the blood signal suppression sequence 62 (that is, the ratio of blood signal suppression sequences 62 to readout sequences is 1:3); accordingly, for the black blood steady state sequence 64" the reduction in data acquisition rate is only 25%.

Thus, as the fraction of readout sub-sequences that are replaced by the blood signal suppression sequence 62 is decreased, imaging data acquisition speed is increased. However, if the fraction of readout sub-sequences that are replaced by the blood signal suppression sequence 62 is too small, then the effectiveness of the blood signal suppression is compromised. Accordingly, a tradeoff can be made between imaging data acquisition speed and the amount of blood signal suppression. For fast-flowing blood, the blood signal suppression sequence 62 should be applied often. In such cases, a high ratio of blood signal suppression sequences 62 to readout sequences, such as a 10:1 ratio, may be employed to provide sufficient blood signal suppression. In contrast, if the blood flow is slow, then the blood signal suppression sequence 62 may be applied less often so as to improve the imaging data acquisition speed. In such cases, a low ratio of blood signal suppression sequences 62 to readout sequences, such as a 1:10 ratio, may be employed to provide sufficient blood signal suppression while maintaining a high imaging data acquisition rate. The suppression sequences can be applied as needed, throughout the imaging sequence, but not necessarily in a fixed ratio.

Figure 5:
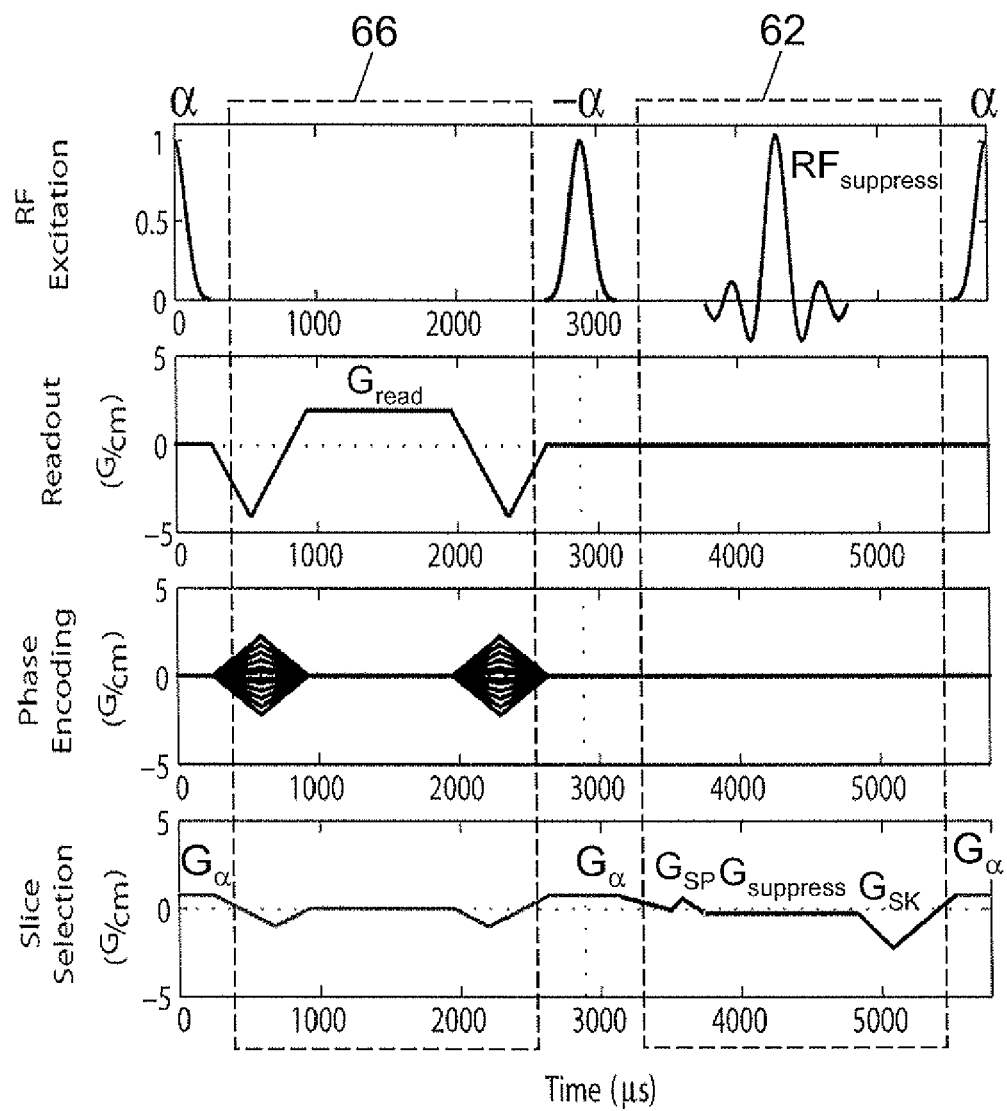
FIG. 5 shows an example pulse sequence for a portion of the imaging sequence of FIG. 2.

With reference to FIG. 5, a portion of a suitable pulse sequence for the black blood steady state sequence 64 of FIG. 2 is shown. In the pulse sequence of FIG. 5, the steady state imaging sequence 60 is a balanced Steady State Free Precession (SSFP) sequence; however, a SSFP, FIESTA, TrueFISP, BFFE, and other steady-state magnetic resonance imaging sequence can be used. The blood signal suppression sequence 62 employs a radio frequency pulse ($RF_{suppress}$) applied along with a slice-selective magnetic field gradient ($G_{suppress}$). Other region-selective gradient combinations are also contemplated. The $RF_{suppress}$ pulse can have substantially arbitrary amplitude and shape, and could include two or more radio frequency pulses, but should be selected to provide a sufficient flip angle while fitting within the time interval between maintenance radio frequency pulses. Pulses with higher time-bandwidth products might take too long too apply unless a thick slab is used. A radio frequency pulse $RF_{suppress}$ having a number of side lobes, as shown in FIG. 5, is expected to provide some beneficial crushing of stationary spins found in the suppression region. Optionally, the $RF_{suppress}$ pulse phase is incremented in an RF spoiling fashion similar to that used in spoiled gradient recalled echo (SPGR), for example with linear or quadratic phase increases between successive applications of the blood signal suppression sequence 62 to reduce the potential for coherence from the stationary spins in the suppression region.

The slice-selective gradient $G_{suppress}$ suitably selects the suppression region as a slab or slice, although otherwise-shaped suppression regions are contemplated. The amplitude and duration of the slice-selective gradient $G_{suppress}$ are selected to comport with the time-bandwidth product of the $RF_{suppress}$ pulse. In some embodiments, the slice-selective magnetic field gradient $G_{suppress}$ has a duration of approximately 3 milliseconds for an $RF_{suppress}$ pulse having a time-bandwidth product of about 50 rad or about 8 sec-Hz, and for a 5 centimeter suppression slab. The amplitude of the slice-selective magnetic field gradient $G_{suppress}$ can be fairly small, and its duration may be, for example, about 1 to 5 milliseconds. In the embodiment of FIG. 5, the slice-selective magnetic field gradient $G_{suppress}$ is of opposite polarity to the imaging slice selection gradient applied $G_\alpha$ during the maintenance radio frequency pulses $\alpha$ and $-\alpha$.

Application of the slice-selective magnetic field gradient $G_{suppress}$, by itself would result in a blood signal suppression sequence which has a non-zero moment applied magnetic field gradient. To compensate, a magnetic field gradient of equal and opposite time-integrated area (i.e., opposite polarity) to the slice-selective magnetic field gradient $G_{suppress}$ can be applied outside of the temporal region of the $RF_{suppress}$ pulse. The spins in the imaging region are not affected by the $RF_{suppress}$ pulse because the slice-selective magnetic field gradient $G_{suppress}$ is not tuned to place the imaging slice at the magnetic resonance frequency. Moreover, by compensating the slice-selective magnetic field gradient $G_{suppress}$ with another magnetic field gradient of equal and opposite time-integrated area thus nulling the zeroeth moment of the overall applied magnetic field gradient, phase accrual in the imaging region is zeroed, so that the magnetic field gradients of the blood signal suppression sequence do not affect the imaging region. In general, the compensating magnetic field gradient can be applied before or after the slice-selective magnetic field gradient $G_{suppress}$ in time, or can be divided into portions applied before and after the slice-selective magnetic field gradient $G_{suppress}$. With respect to maintaining balance of the steady state excitation, the key aspect is to have substantially no zeroeth moment applied magnetic field gradient during the blood signal suppression sequence 62.

Another potentially adverse effect of the blood signal suppression sequence 62 relates to the stationary spins of the suppression region. If these stationary spins retain coherence, they continue to produce a magnetic resonance signal which may appear as an artifact in the images acquired from the imaging region. In effect, these spins undergo a balanced sequence too and can therefore be refocused any time the time-integrated area cancels out to zero. However, if appropriately crushed, the stationary spins in the suppression region remain dephased so as to not produce a net signal as they spend the imaging readout time in an non-coherent state. The magnetic field gradient applied to compensate for the slice-selective magnetic field gradient $G_{suppress}$ advantageously also provides some crushing of the stationary spins in the suppression region. However, to further dephase these spins and ensure complete signal cancellation by introducing a large phase twist within each image element of the suppression region, it is advantageous to add extra crushing gradient area. Adding more area increases the zeroeth moment of these spins, effectively dephasing them more. If an RF-spoiling scheme similar to that used in SPGR is used, then further suppression can be achieved.

Accordingly, with continuing reference to FIG. 5, a crusher or dephasing magnetic field gradient ($G_{SK}$) is applied after the slice-selective magnetic field gradient $G_{suppress}$ in time. The crusher gradient $G_{SK}$ has an opposite and larger time-integrated area than the slice-selective magnetic field gradient $G_{suppress}$. To provide the blood signal suppression sequence 62 with substantially no zeroeth moment applied magnetic field gradient. A prewinder magnetic field gradient ($G_{SP}$) is applied prior to slice-selective magnetic field gradient $G_{suppress}$. In the blood signal suppression sequence 62, the prewinder magnetic field gradient $G_{SP}$ is integrated with the balancing magnetic field gradient associated with the preceding $-\alpha$, radio frequency pulse. To maintain a substantially nulled zeroeth moment applied magnetic field gradient for the blood signal suppression sequence 62, the total time-integrated area of the magnetic field gradients should be substantially zero, i.e., $A(G_{SP})+A(G_{suppress})+A(G_{SK})\approx0$, where $A(\ldots)$ denotes the time-integrated area.

Figure 6:
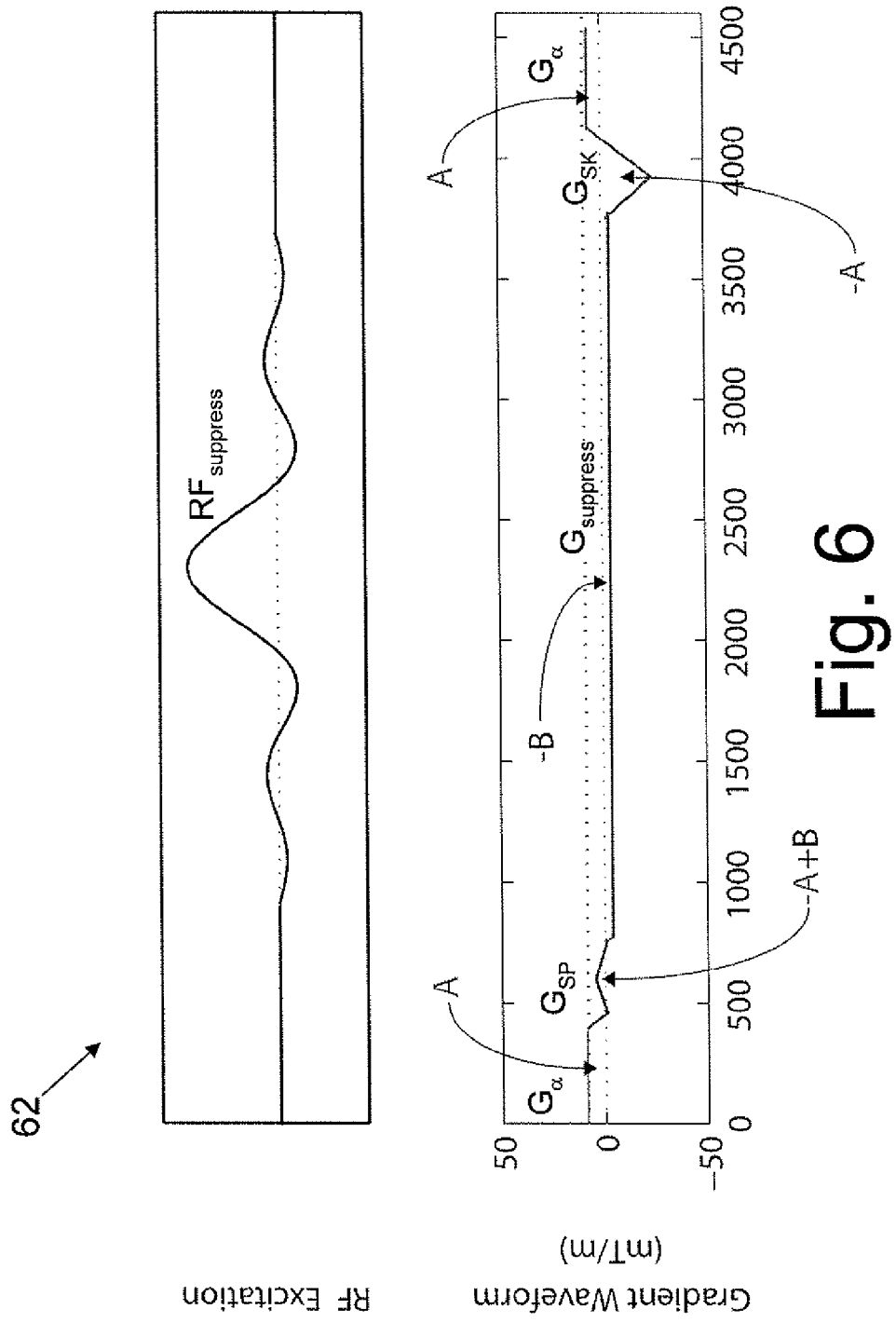
FIG. 6 shows the blood signal suppression sequence component of the pulse sequence of FIG. 5, with the time-integrated areas of selected magnetic field gradients labeled.

With reference to FIG. 6, a suitable determination of the magnetic field gradients for the blood signal suppression sequence 62 is illustrated. The magnitude of the time-integrated area of the slice-selective magnetic field gradient $G_{suppress}$ is denoted "B", while the magnitude of the time-integrated area of the desired crusher magnetic field gradient $G_{SK}$ is denoted "A". The latter area A is selected to be the same as one-half the time-integrated area of the balancing magnetic field gradient associated with a steady state maintenance $\alpha$ radio frequency pulse. Then, the prewinder magnetic field gradient $G_{SP}$ has time-integrated area $-A+B$ and is suitably integrated with the balancing magnetic field gradient of area $+A$ associated with the preceding $-\alpha$ radio frequency pulse as shown. The total zeroeth moment of the applied magnetic field gradient over the complete sequence is then $A(G\alpha)+A(G_{SP})+A(G_{suppress})+A(G_{SK})+A(G_\alpha)=(A)+(-A+B)+(-B)+(-A)+(A)=0$.

Figure 7:
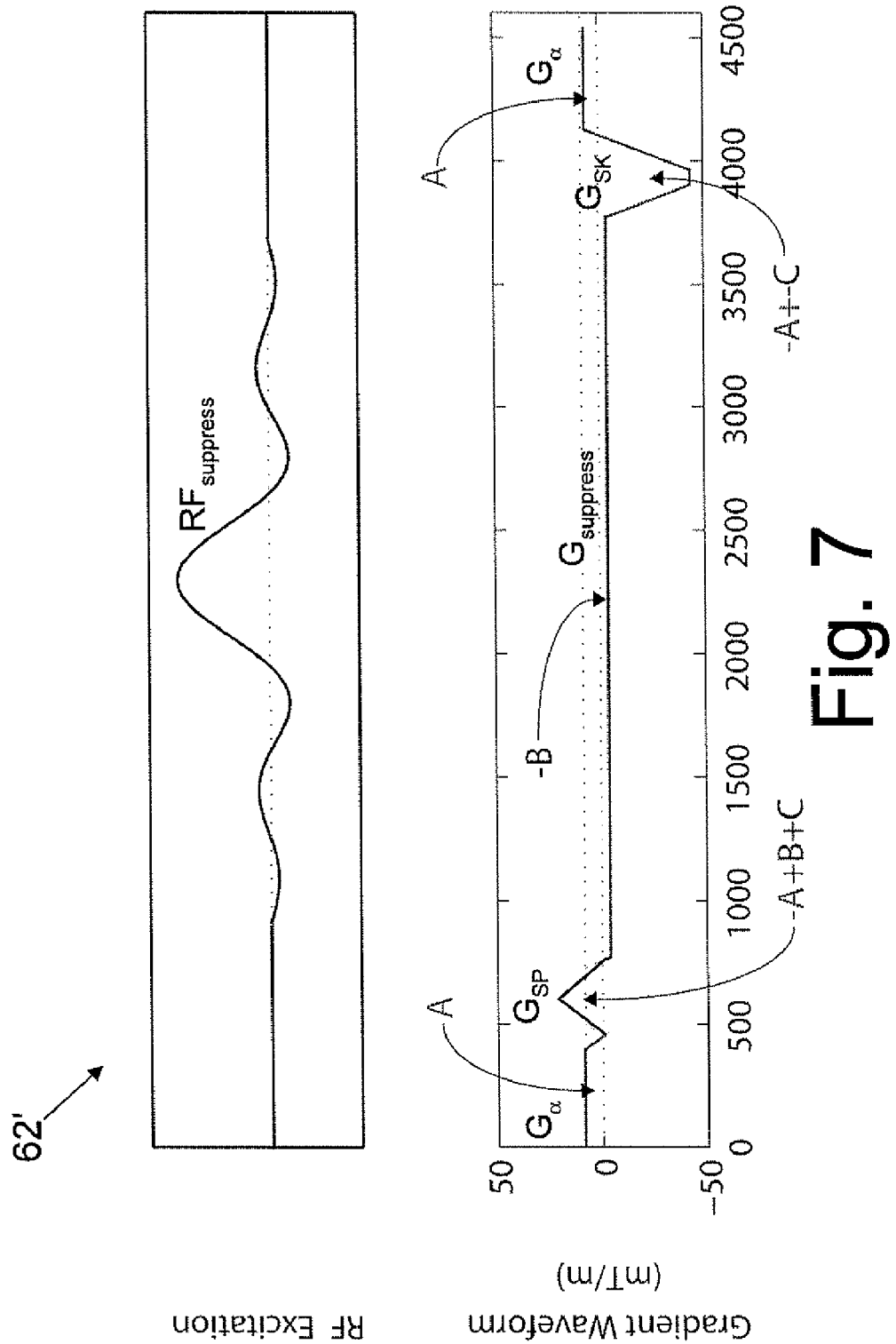
FIG. 7 shows another blood signal suppression sequence with the time-integrated areas of selected magnetic field gradients labeled, in which a larger crusher or dephasing magnetic field gradient is applied.

With reference to FIG. 7, a modified blood signal suppression sequence 62' is illustrated. The blood signal suppression sequence 62' is modified respective to the blood signal suppression sequence 62 in that the crusher magnetic field gradient $G_{SK}$ has a larger magnitude time-integrated area $-A+C$. Then, the prewinder magnetic field gradient $G_{SP}$ has time-integrated area $-A+B+C$ and is again suitably integrated with the balancing magnetic field gradient of area $-A$ associated with the preceding $-\alpha$ radio frequency pulse as shown. The total zeroeth moment of the applied magnetic field gradient over the entire combination of maintenance and suppression sequences is then $A(G\alpha)+A(G_{SP})+A(G_{suppress})+A(G_{SK})+A(G\alpha)+=A+(-A+B+C)+(-B)+(-A-C)+A=0$. The area component "C" can be selected to provide the desired amount of crushing of the stationary spins in the suppression region, while maintaining a substantially nulled zeroeth moment applied magnetic field gradient for the blood signal suppression sequence 62'.

In the sequences of FIGS. 5-7, the crusher magnetic field gradient and corresponding prewinding gradient are applied in a slice-select direction that is also used to select the imaging and suppression regions as slices. However, the crusher magnetic field gradient and corresponding prewinding gradient can also be applied in one or more directions other than or in addition to the slice-select direction.

The suppression region is different from the imaging region. The different suppression region in some embodiments may partially overlap or intersect with the imaging region. In this case, the magnetic resonance signal from the imaging region will be disturbed in the area of the overlap or intersection, and the image may include artifacts due to such disturbance. However, this disturbance is not detrimental unless the organ or tissue of interest falls within this overlap or intersection region, in which case reorientation of the suppression volume can be performed avoid artifacts.

Another approach for further reducing the signal contribution from stationary spins in the suppression region is to alternate the polarities of the suppression slab selection, crusher, and optional crusher compensation gradients $G_{suppress}$, $G_{SK}$, $G_{SP}$. Doing so should provide increased crushing as opposed to periodic refocusing as the areas of the crushing gradients will sum instead of cancel between repetitions of the blood signal suppression sequence.

A balanced steady state imaging sequence has null zeroeth and first moments for the slice selection magnetic field gradient. The applied slice selection magnetic field gradient is a time-symmetric, area-balanced waveforms. The blood signal suppression sequence 62 of FIGS. 5 and 6 has null zeroeth moment, but the first moment is not completely nulled. The first moment remaining is however small in magnitude as the gradients switch polarity consistently and should only affect spins that have in-plane motion in the imaging region. Optionally, extra magnetic field gradient lobes can be incorporated into the suppression sequence so as to tailor the magnetic field gradient to have a substantially nulled first moment as well. The blood signal suppression sequence 62' of FIG. 7 has a larger first moment than the blood signal suppression sequence 62, due to the additional asymmetry introduced by the additional "C" area component. A trade-off can be made between the magnitude of the crushing magnetic field gradient (and hence the suppression of signal from stationary spins in the suppression region) and the deviation of the first moment from the null first moment condition.

In another approach, the some or all of the crushing of the stationary spins in the suppression region can be achieved by making the $RF_{suppress}$ radio frequency pulse a time-reversed self-refocusing pulse. Typical slice-selective radio frequency pulses are refocused by a following magnetic field refocusing gradient that removes linear phase induced in the through-slice direction. However, self-refocusing radio frequency pulses have been designed, for example as described in Roberts et al., "A Simple Method for the Construction of 180 degree Refocusing RF Pulses for Use In Nuclear Magnetic Resonance Imaging", Journal of Magnetic Resonance, Series B (1993) volume 101 pages 78-82. Self-refocusing radio frequency pulses provide refocusing of the magnetization with a reduced or eliminated following refocusing magnetic field gradient pulse. However, a time-reversed self-refocusing radio frequency pulse has the opposite effect: it tends to increase the amount of phase accrued by the spins in the through-slice direction. This is analogous to the effect of the crushing gradient $G_{SK}$. Accordingly, in some embodiments the $RF_{suppress}$ radio frequency pulse is a time-reversed self-refocusing pulse that provides at least some crushing of the stationary spins in the suppression region. In these embodiments, the crushing gradient $G_{SK}$ can be reduced in magnitude, or optionally eliminated entirely. However, compensatory magnetic field gradient should be applied before and/or after the slice-selective $G_{suppress}$ magnetic field gradient to ensure that the blood signal suppression sequence has substantially no zeroeth moment applied magnetic field gradient.

The degree of blood signal suppression or incoherence in the moving spins of blood flowing into the imaging region from the suppression region depends on various factors, such as the amount of time spent in the suppression region (related to the blood flow velocity), the suppression flip angle, and the suppression frequency (quantified, for example, by the ratio of blood signal suppression sequences 62 to readout sequences as discussed with reference to FIGS. 2-4). The thickness of the imaging region is also a factor to consider. During their residence in the suppression region, moving spins are imparted with a large phase twist by the blood signal suppression sequence 62 that leads to a substantially dephased signal. The phase twist varies along the slice- or slab-selection direction. For these spins not to add up to a coherent signal, there should be at least $2\pi$ dephasing in the 'bolus' of moving spins entering the imaging slice.

If spins flow rapidly, then the suppression of the signal from moving spins has to occur quickly, calling for the use of a higher ratio of blood signal suppression sequences 62 to readout sequences, and/or the use of higher flip angles to get better blood signal suppression. In some embodiments, the blood signal suppression takes place over 2-4 $RF_{suppress}$ cycles. For example, if TR=3 ms, three suppression pulses are applied after 18 milliseconds (assuming the $RF_{suppress}$ is applied every other TR as in FIG. 2). If a slab 10 centimeter in diameter were used as the suppression region, then to achieve 90% signal suppression in three excitation suppression cycles, the spins should spend 18 milliseconds in the 10 centimeter suppression region and the use of a 62° suppression flip angle. Equivalently, the spins would have to be traveling slower than ~0.55 centimeters/millisecond. Furthermore, if the spins receive three cycles of suppression, then the remaining magnetization would have amplitude proportional to $\cos^3$ (suppression flip angle), if not performing SPGR, or less if so. For example, if a 60° pulse is used, then the signal leaving the suppression region after three excitations cycles would have approximately 12% of it's original magnitude. If a 75° pulse were used, the exiting spins would have 2% of their original magnetization. Hence, the frequency and excitation flip angle of application of the $RF_{suppress}$ pulse can be tuned to the known velocities in the blood. In general, the more $RF_{suppress}$ pulses felt by the moving spins, the better the blood signal suppression.

The suppression region targeted by the blood signal suppression sequence can be of varying size, ranging from a thin slice to a wide slab. In some embodiments, the $RF_{suppress}$ excitation is an adiabatic (half-passage) excitation, which provides substantial blood signal suppression with magnetic field gradients that are relatively small and readily nulled out. The black blood steady state imaging sequences disclosed herein are applicable to both two-dimensional and three-dimensional imaging, and are applicable to Cartesian, spiral, radial k-space, or other sampling patterns.

The black blood steady state imaging sequences disclosed herein are suitable for acquiring black blood arteriograms, black blood venograms, and mixed black blood vasculature images, by suitable placement of the suppression region respective to the imaging region. For arteriograms, the suppression region should be arranged to suppress arterial blood flow into the imaging region. For venograms, the suppression region should be arranged to suppress venous blood flow into the imaging region. Usually, the suppression region for venograms and the suppression region for arteriograms are on generally opposite sides of the imaging region. For example, for leg imaging using axial slices, the venogram suppression slice is closer to the feet than the imaging slice, while the arteriogram suppression slice is further from the feet than the imaging slice. By applying the blood signal suppression sequence to both the arteriogram suppression slice and the venogram suppression slice (for example, in different intervals between maintenance radio frequency pulses), a mixed black blood vasculature image is obtained. Alternatively, the venogram and arteriogram can be combined in post-acquisition processing to generate the mixed black blood vasculature image.

For vessel wall imaging, the black blood steady state imaging sequence is suitably used to remove the bright signal from blood, allowing for high resolution imaging of the vessel walls. In a peripheral angiography setting, the black blood steady state imaging sequence is used in combination with the unmodified steady state imaging sequence to generate images of blood vessels by subtracting the black blood images from the unmodified images. Furthermore angiograms of both venous and arterial vasculature can be obtained by suppression flow from different directions in different acquisitions If both are suppressed, then images with null signal from blood could be achieved. Furthermore, it is contemplated to tune the frequency of application of the blood signal suppression sequences to distinct regions dependent on how fast blood traverses those regions. This latter approach should work even if blood signal suppression is incomplete, as the subtraction of two the images sets will yield an angiographic image because blood signal is so much higher than the signal from other tissues in typical steady state imaging.

In a cardiac function imaging (cine setting), the suppression region may include the lungs, the lungs, suppressing the spins from blood undergoing oxygenation in the lungs, and decreasing the signal intensity of blood in the left atrium and ventricle of the heart. Similarly, the if the suppression region includes the inferior and superior vena cavae, the right atria and ventricle can be captured in a black blood cine mode. This approach is of interest in that it permits the acquisition of the very common steady state imaging cines for functional analysis in a black blood mode.

In a coronary imaging setting, the suppression region can include the left ventricle of the heart, such that blood leaving the ventricle during the systolic ejection period would be suppressed. The blood then entering the coronary ostia would have reduced signal intensity and the acquisition could proceed in an uninterrupted manner. If the blood signal suppression sequence is applied more often, moving spins are further suppressed, assuming that they spend enough time in the suppression region to undergo multiple excitations by successive $RF_{suppress}$ pulses. However, the blood signal suppression sequence can be applied less often by using higher flip angles, thus increasing the imaging data acquisition efficiency.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

Have thus described the preferred embodiments, the invention is now claimed to be:

1. An imaging method comprising:
    applying periodic maintenance radio frequency pulses to maintain a steady state magnetic resonance excitation in an imaging region;
    performing readout of imaging data from the imaging region during selected intervals between maintenance radio frequency pulses; and
    performing a spatially selective blood signal suppression sequence during selected other intervals between maintenance radio frequency pulses, the blood signal suppression sequence suppressing a blood signal in a suppression region different from the imaging region, the blood signal suppression sequence having substantially no zeroeth moment applied magnetic field gradient.

2. The imaging method as set forth in claim 1, wherein the blood signal suppression sequence has substantially no first moment applied magnetic field gradient.

3. The imaging method as set forth in claim 1, wherein the blood signal suppression sequence includes:
    a spatially selective radio frequency excitation directed to the suppression region and employing a spatial selection magnetic field gradient, a phase of the spatially selective radio frequency excitation applied in successive selected other intervals being incremented to induce RF spoiling.

4. The imaging method as set forth in claim 1, wherein the blood signal suppression sequence includes:
    a spatially selective radio frequency excitation directed to the suppression region and employing a spatial selection magnetic field gradient; and
    a dephasing magnetic field gradient having a time-integrated area equal to and opposite of an area of the spatial selection magnetic field gradient.

5. The imaging method as set forth in claim 1, wherein the blood signal suppression sequence includes:
    (i) a compensatory magnetic field gradient followed by (ii) a spatially selective radio frequency excitation directed to the suppression region and employing a spatial selection magnetic field gradient followed by (iii) a dephasing magnetic field gradient, a combined time-integrated area of the compensatory magnetic field gradient, the dephasing magnetic field gradient, and the spatial selection magnetic field gradient being substantially zero.

6. The imaging method as set forth in claim 5, wherein the compensatory magnetic field gradient is integrated with a balancing magnetic field gradient associated with a preceding periodic maintenance radio frequency pulse.

7. The imaging method as set forth in claim 1, wherein the blood signal suppression sequence includes:
    a time-reversed self-focusing spatially selective radio frequency pulse.

8. The imaging method as set forth in claim 1, wherein the suppression region is disposed upstream of venous blood flow respective to the imaging region.

9. The imaging method as set forth in claim 1, wherein the suppression region is disposed upstream of arterial blood flow respective to the imaging region.

10. The imaging method as set forth in claim 1, wherein the suppression region includes a venous suppression region portion disposed upstream of venous blood flow respective to the imaging region and an arterial suppression region portion disposed upstream of arterial blood flow respective to the imaging region.

11. The imaging method as set forth in claim 1, wherein a ratio of the selected intervals to the selected other intervals is between 1:10 and 10:1.

12. The imaging method as set forth in claim 1, wherein the imaging region includes a portion of at least one leg, a portion of at least one arm, a portion of at least one lung, or a portion of the heart.

13. The imaging method as set forth in claim 1, further comprising:
    repeating the applying and performing operations over time to acquire a cine temporal sequence.

14. An apparatus for performing the imaging method as set forth in claim 1.

15. A magnetic resonance imaging system comprising:
    a main magnet which generates a static magnetic field at least in an imaging region;
    a gradient generating system which superimposes selected magnetic field gradients on the static magnetic field at least in the imaging region;
    a radio frequency system including at least one radio frequency coil arranged to transmit radio frequency pulses into the imaging region and to receive magnetic resonance signals from the imaging region;
    a reconstruction processor which reconstructs the received magnetic resonance signals to form a reconstructed image; and
    a sequence controller that controls the gradient generating system and the magnetic resonance excitation system according to the imaging method of claim 1.

16. An imaging method comprising:
    performing a steady state magnetic resonance imaging sequence configured to image an imaging region; and
    during the performing, replacing selected readout portions of the steady state magnetic resonance imaging sequence with a spatially selective moving tissue signal alteration sequence configured to alter a signal of the moving tissue in a moving tissue alteration region from which the moving tissue moves into the imaging region, the moving tissue signal alteration sequence having substantially no zeroeth moment applied magnetic field gradient.

17. The imaging method as set forth in claim 16, wherein the moving tissue alteration sequence also has substantially no first moment applied magnetic field gradient.

18. The imaging method as set forth in claim 16, wherein the moving tissue alteration sequence includes:
    a spatially selective radio frequency excitation directed to the alteration region and employing a spatial selection magnetic field gradient, a phase of successive applications of the spatially selective radio frequency excitation being incremented to induce RF spoiling.

19. The imaging method as set forth in claim 16, wherein the moving tissue alteration sequence includes:
   (i) a compensatory magnetic field gradient followed by (ii) a spatially selective radio frequency excitation directed to the alteration region and employing a spatial selection magnetic field gradient followed by (iii) a dephasing magnetic field gradient, a combined time-integrated area of the compensatory magnetic field gradient, the dephasing magnetic field gradient, and spatial selection magnetic field gradient being substantially equal to zero.

20. The imaging method as set forth in claim 16, wherein the moving tissue alteration sequence includes:
   a time-reversed self-focusing spatially selective radio frequency pulse.

21. The imaging method as set forth in claim 16, wherein the moving tissue includes flowing blood and the alteration includes suppression of magnetic resonance signal from said flowing blood.

22. An apparatus for performing the imaging method as set forth in claim 16.

23. An imaging method comprising:
   applying periodic maintenance radio frequency pulses to maintain a steady state magnetic resonance excitation in an imaging region;
   in an interval between two successive maintenance radio frequency pulses, performing readout of imaging data from the imaging region without performing a spatially selective blood signal suppression sequence; and
   in an interval between two successive maintenance radio frequency pulses, performing a spatially selective blood signal suppression sequence without performing readout of imaging data, the spatially selective blood signal suppression sequence suppressing a blood signal in a suppression region different from the imaging region, the blood signal suppression sequence having substantially no zeroeth moment applied magnetic field gradient.

* * * * *